United States Patent [19]

Tanaka et al.

[11] Patent Number: 4,994,221
[45] Date of Patent: Feb. 19, 1991

[54] METHOD FOR THE PRODUCTION OF A CARBON ELECTRODE

[75] Inventors: Hideaki Tanaka, Tenri; Nobuhiro Yanagisawa, Nara, both of Japan

[73] Assignee: Sharp Kabushiki Kaisha, Osaka, Japan

[21] Appl. No.: 360,307

[22] Filed: Jun. 2, 1989

[30] Foreign Application Priority Data

Jun. 3, 1988 [JP] Japan .............................. 63-138155

[51] Int. Cl.$^5$ ..................... B29C 43/18; B23B 31/20; C01B 31/00
[52] U.S. Cl. ..................................... 264/81; 264/105; 264/136; 264/257; 264/85; 427/122; 427/123; 427/126.3; 427/249; 427/250; 427/404; 427/419.2; 204/130
[58] Field of Search ................. 264/134, 81, 105, 136, 264/257, 85; 427/249, 122, 123, 126.3, 250, 404, 419.2; 204/130, 131; 252/502, 503, 506

[56] References Cited

U.S. PATENT DOCUMENTS 4,321,114  3/1982  MacDiarmid et al. .............. 204/2.1

FOREIGN PATENT DOCUMENTS 63-245858  10/1988  Japan .
1163979  9/1969  United Kingdom .................. 264/81

Primary Examiner—James Lowe
Assistant Examiner—Christopher A. Fiorilla

[57] ABSTRACT

A method for producing a carbon electrode which includes directly depositing a carbon material on an electroconductive electrode substrate by chemical vapor deposition using hydrocarbons and/or their derivatives as a starting material, and subjecting the substrate coated with the carbon material to an electrochemical treatment so that the carbon material is doped with a charge carrier material capable of being reversely intercalated therein and deintercalated therefrom. Thereafter, the electrochemically treated substrate is compressed, and a thin plate-shaped carbon electrode with a high density results.

11 Claims, 2 Drawing Sheets

METHOD FOR THE PRODUCTION OF A CARBON ELECTRODE

BACKGROUND OF THE INVENTION

1. Field of the Invention

This invention relates to a method for producing of a carbon electrode that is useful for thin-type batteries which are suitable as power supplies for various thin and minaturized equipment. More particularly, it relates to a method for producing a thin-type carbon electrode having a high density and a high capacity.

2. Description of the Related Art

For conventional batteries used in electronic equipment, a battery structure is widely used wherein an electroconductive material, such a graphite, and a binding agent are admixed with an electrode active material. The mixture is coated on a current-collector such as a metal net so as to form a thin-type electrode. This electrode is disposed opposite to a counter electrode in a battery can and a separator is interposed between these electrodes. The battery contents are impregnated with an electrolytic solution, and sealing up of the battery can follows.

However, the electrode manufactured by the above-mentioned method is disadvantageous in that the electric contact of the electrode active material with the electroconductive material or the current-collector is poor, and an increase in the internal resistance of the battery fabricated with the electrode results. Moreover, the electroconductive material and the binding agent are required in addition to the electrode active material, so that the electrode active material is limited in its amount, which causes a decrease in the battery capacity.

In order to solve the problems of the conventional electrodes mentioned above, a method for producing a carbon electrode in which a three-dimensionally structure, substance such as a porous substance or the like, is used as an electrode substrate. A carbon material (i.e., an electrode active material) is directly deposited on the surface of the substrate by chemical vapor deposition, and the substrate coated with the carbon material is compressed to a predetermined thickness. Thereby, a thin-type carbon electrode with a high density results (Japanese Laid-Open Patent Publication No. 63-245858).

In U.S. Pat. No. 4,931,240 a method for producing a carbon electrode is disclosed which is similar to the above-mentioned method. The production exception is carbon material directly deposited on the electrode substrate is filled with a charge carrier material before compressing the electrode substrate.

For the purpose of further improving the electrode activity, the conventional electrode for batteries is often subjected to an electrochemical treatment in advance of fabricating the battery. Whereby the electrode active material contained in the electrode is electrochemically doped with a charge carrier material in a given electrolytic solution. In particular, when a carbon material (e.g., graphite) is used as the electrode active material, the electro-chemical treatment is performed. Thereby, the carbon material is doped with a charge carrier material capable of being reversibly intercalated therein and deintercalated therefrom.

However, when the thin-type electrode, which has been obtained by compressing the three-dimensionally structured substance coated with the carbon material, is electrochemically treated in an electrolytic solution, a significant change in the dimensions of the electrode will occur, which arises from a change in the volume of the electrode active material or from the relaxation of compressive stresses during the formation of the electrode. Thus, in some cases, there are many disadvantages in the fabrication of batteries that the electrode used may be cracked easily or get out of shape. Moreover, even after fabricating the battery with such an electrode, the mechanical strength of the electrode used is insufficient to keep its shape. Thereby, it is difficult to obtain a battery with satisfactory durability.

SUMMARY OF THE INVENTION

The inventors of the present application have discovered that a thin-type carbon electrode, which is obtained by subjecting a three-dimensionally structured substance coated with a carbon material to an electrochemical treatment and then compressing the electrochemically treated substance, has a high stability in shape and serves an an electrode for batteries with a large battery capacity. Based on this fact, the inventors have succeeded in producing a carbon electrode having excellent electrode characteristics.

A method for producing a carbon electrode in the present application which overcomes the above-discussed and numerous other disadvantages and deficiencies of the conventional art, comprises directly depositing a carbon material on an electroconductive electrode substrate by chemical vapor deposition using hydrocarbons and/or their derivatives as a starting material, subjecting the substrate coated with the carbon material to an electrochemical treatment so that the carbon material is doped with a charge carrier material capable of being reversely intercalated therein and deintercalated therefrom. Thereafter the electrochemically treated substrate is compressed and a thin plate-shaped carbon electrode with a high density results.

In a preferred embodiment, the electrode substrate is a three-dimensionally structured substance.

In another preferred embodiment, the three-dimensionally structured substance is a metal sponge, woven cloth of metal fibers, a nonwoven cloth of metal fibers, or a metal net.

In another preferred embodiment, the charge carrier material is an electron-donating substance such as alkali metals, alkali earth metals, rare earth metals, or the like.

In a preferred embodiment, the charge carrier material is an electron-accepting substance such as halogens, halogen compounds, metal oxides, oxo acids, hydrides, or the like.

Thus, the embodiments of the present invention described herein makes possible the objectives of (1) providing a method for producing a carbon electrode in which the carbon material is directly deposited on an electrode substrate as an active material and then subjected to an electrochemical treatment before compressing the electrode substrate, thereby a thin-type electrode with a high density of discharging capacity and high stability in shape is produced which allows a higher production yield; (2) providing a method for producing a carbon electrode in which the carbon material is directly deposited as an active material on an electrode substrate as a current-collector, so that the active material is electrically and mechanically connected to the current-collector without the use of binding agents or electroconductive materials, thereby an electrode for batteries results with a large battery capacity; (3) providing a method for producing of a carbon electrode in which the electrode substrate coated with the carbon material is compressed after being subjected to an electrochemical treatment, thereby a thin-type electrode with a high accuracy in dimensions and a high strength is produced. (4) providing a method for producing carbon electrode in which the carbon material is directly deposited as an active material on an electrode substrate and compressed, so that the density of discharging capacity of the electrode can be increased but cannot deteriorate by a repeated charge-discharge cycle over a long period of time. Thereby an electrode for batteries with excellent charge-discharge cycle characteristics and a high energy density results; and (5) providing a method for producing a carbon electrode in which the electrode substrate coated with the carbon material is compressed after being subjected to an electrochemical treatment, so that accuracy in the dimensions and shape of the electrode can be increased, thereby the occurrence of a short circuit and other disadvantages in the fabrication of batteries are reduced, which allows a great improvement in the production yield.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
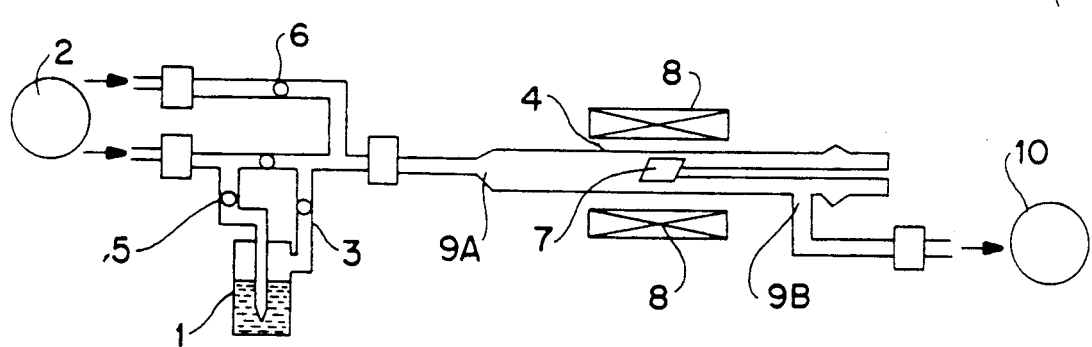
FIG. 1 is a schematic diagram showing illustrating an apparatus for the deposition of a carbon material that is used in the method for the production of a carbon electrode in an embodiment of the present invention.

The carbon electrode for an embodiment of the present invention can be obtained by directly depositing a carbon material (i.e., an electrode active material) on an electrode substrate, subjecting the substrate coated with the carbon material to an electrochemical treatment, and thereafter compressing the electrochemically treated substrate.

The carbon material can be deposited on an appropriate substrate by chemical vapor deposition at low temperatures using hydrocarbon starting compounds. Examples of the hydrocarbon compounds which can be used are aliphatic hydrocarbons, aromatic hydrocarbons, alicyclic hydrocarbons, and the like. These hydrocarbons can contain various heteroatoms such as nitrogen, oxygen, etc., and/or can have substituents, examples of which are halogen, hydroxyl groups, sulfo groups, nitro groups, nitroso groups, amino groups, azo groups, carboxy groups, etc. Specific examples thereof are benzene, naphthalene, anthracene, hexamethylbenzene, 1, 2- dibromobenzene, 2-butyne, acetylene, biphenyl, diphenylacetylene, etc. Aromatic hydrocarbons such as benzene, etc., are preferably used. Although the concentration and temperature of hydrocarbon compounds in the atmosphere to be thermally decomposed depend upon the kind of starting hydrocarbon compounds, they are usually set to be several millimolar percent and about 1000° C., respectively. A typical method for vaporizing hydrocarbon compounds is a bubbling method in which argon gas is used as a carrier gas. The hydrocarbon compounds can also be vaporized by the bubbling method in which other kinds of gases are used as a carrier gas, or by evaporation, sublimation, etc. The vaporized hydrocarbon compounds are supplied to a chemical vapor deposition chamber and thermally decomposed therein.

The electrode substrate on which a carbon material is deposited by chemical vapor deposition is a three-dimensionally structured substance, which can be any form such as a foam (i.e., sponge), wool, woven-cloth, nonwoven-cloth, net, etc., but must have flexibility so as to change its shape when compressed externally, and have electroconductivity. Specific examples thereof are a metal sponge, a woven or a nonwoven cloth of metal fibers, a metal net, and the like. As a three-dimensionally structured substance, a substance can also be used that has a surface coated with an electroconductive material.

The electrode substrate coated with a carbon material is then electrochemically treated in an electrolytic solution so that a charge carrier material contained in the electrolytic solution is intercalated in the carbon material. A typical method for the electrochemical treatment involves immersing the coated substrate as a working electrode and a counter electrode in an electolytic cell containing the electrolytic solution, which allows a current to flow therebetween. For example, when the finished carbon electrode of the present embodiment is used as a negative electrode for batteries with a nonaqueous electrolytic solution, lithium electrodes are employed for a counter electrode and a reference electrode, and a current is allowed to flow in the cathodic direction using the three-electorde method. As a way of allowing a current to flow, a constant-current technique, a constant-potential technique, and the like may be used. As the electrolytic solution is used, a solution of aprotic organic solvent such as propylene carbonate, ethylene carbonate, tetrahydrofuran, 2-methyltetrahydrofuran, $\gamma$-butyrolactone, dimethylsulfoxide, 1,2-dimethoxyethane, 1,3-dioxolane, etc., containing an electrolyte, which provides a light metal cation as a charge carrier material such a lithium perchlorate, lithium borofluoride, lithium hexafluoroarsenate, lithium hexafluorophosphate, lithium trifluoromethanesulfonate, etc. As the charge carrier material capable of being reversely intercalated in and deintercalated from the carbon material, an electron-donating substance such as alkaline metals, alkali earth metal, rare earth metals, etc., or an electron-accepting substance such a halogens, halogen compounds, metal oxides, oxo acids, hydrides, etc., can be used.

The electrode substrate treated electro-chemically is then formed by the application of an external pressure thereto and a thin-type carbon electrode with high density and high a capacity results. Preferably, the electrode substrate is compressed by means of rollers, but it can also be compressed by a press-forming machine or other pressing devices and methods. The degree of compression can be controlled within the limits of a thickness to which the three-dimensionally structured substance can be compressed, so that it is possible to obtain a carbon electrode with a desired thickness within these limits.

The resulting thin-type carbon electrode is constituted of an electrode substrate with a high density, which is obtained by compressing the electro-conductive and flexible three-dimensionally structured substance, and a compressed carbon material with a high density, which is directly deposited on the three-dimensionally structured substance being electro-chemically doped with a charge carrier material before being compressed. The carbon electrode is cut in a desired size and each piece is used as an electrode for batteries, and particularly thin-type batteries. This carbon electrode can be used as a positive electrode and/or a negative electrode depending upon the kind of charge carrier material.

EXAMPLE

The direct deposition of the carbon material (i.e., an electrode active material) on the electrode substrate is performed, by using a reaction apparatus illustrted in FIG. 1, as follows: To a vessel 1, which contains benzene that has been dehydrated and refined by vacuum distillation, argon gas is supplied from an argon gas supplier 2 so as to bubble the benzene. Then, the vaporized benzene is supplied to a quartz reaction tube 4 through a Pyrex glass tube 3. At this time, the vessel 1 is heated to compensate for energy loss due to evaporation of benzene, so that the liquid benzene in the vessel 1 can be maintained at a fixed temperature, and the flow rate of the argon gas is controlled by needle valves 5 and 6, so that the amount of benzene to be supplied into the reaction tube 4 can be controlled at a fixed level. In the reaction tube 4, a sample holder 7 is provided on which a three-dimensionally structured substance (the length, width and thickness thereof being 28 mm, 18 mm and 1.5 mm, respectively) that is made of foamed nickel is placed. A furnance 8 surrounds the outside of the reaction tube 4. This furnace 8 keeps the holder 7 and the three-dimensionally structured substance on the holer at about 1000° C. The reaction tube 4 is at one end a Pyrex glass branch tube providing a gas inlet 9A. At the other end of the reaction tube 4, there is disposed a Pyrex glass branch tube providing a gas outlet 9B. When benzene is supplied into the reaction tube 4 through the gas inlet 9A, the benzene is thermally-decomposed within the reaction tube 4. The thermally-decomposed benzene is deposited as a carbon material on the whole area of the three-dimensionally structured substance for about 60 minutes. The gas remaining in the reaction tube 4 after the thermal decomposition is removed through the gas outlet 9B by using an exhaust system 10.

Figure 2:
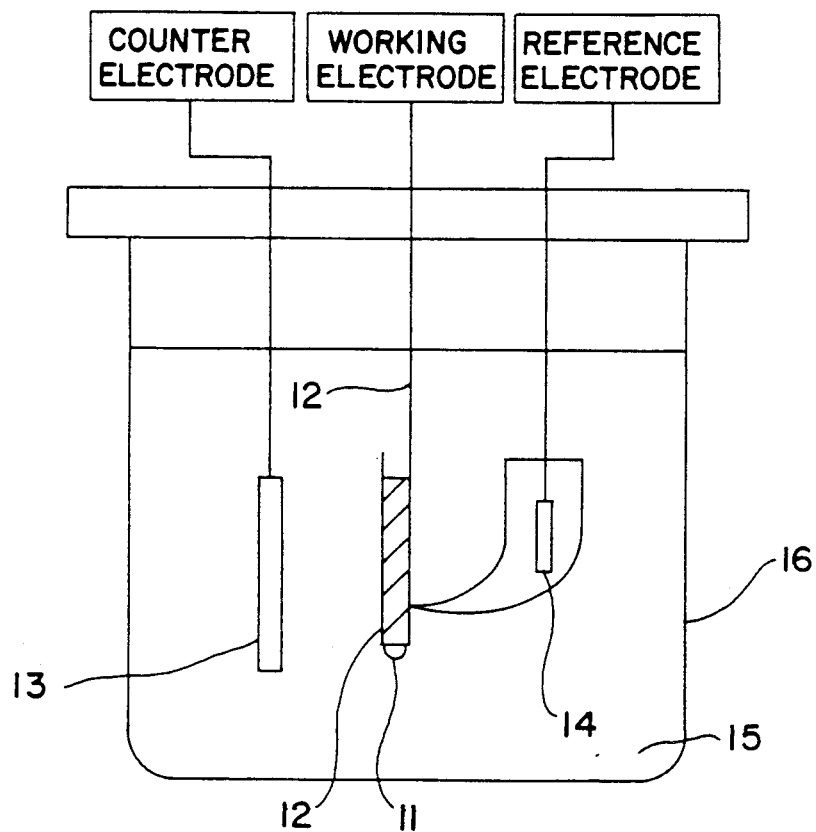
FIG. 2 is a schematic diagram illustrating an electrolytic cell that is not only used for the electrochemical treatment of the carbon electrode in an embodiment of the present invention, but is also used to determine the discharging capacity and electric potential of the electrode.

The three-dimensionally structured substrate on which the carbon material is directly deposited as described above was then subjected to an electro-chemical treatment, using an electrolytic cell 16 illustrated in FIG. 2, as follows: In the electrolytic cell 16, the substrate coated with the carbon material is fixed as a working electrode 11 by a current-collecting rod 12 and lithium electrodes are used as a counter electrode 13 and a reference electrode 14. An electrolytic solution 15 is a solution of propylene carbonate containing 1-M lithium perchlorate as an electrolyte. The working electrode 11 is electrically connected to the counter electrode 13 by an external electric circuit and then left overnight to yield the electric potential of 30 millivolts vs. the lithium electrode.

Figure 3:
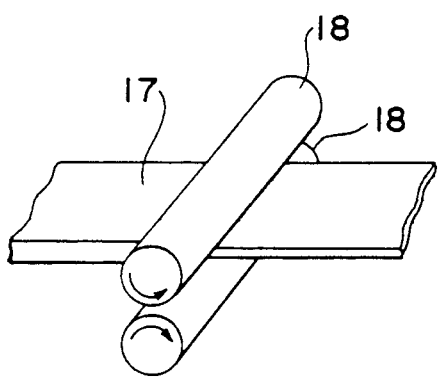
FIG. 3 is a perspective view illustrating a rolling process by which a three-dimensionally structured substance coated with the carbon material is compressed in an embodiment of the present invention.

In this way, the carbon material that had been directly deposited on the electrode substrate is doped with lithium ions as a charge carrier material, and an electrochemically treated substrate resuslts. As illustrated in FIG. 3, the electrochemically treated substrate 17 was then compressed by rollers 18 and cut into pieces of a predetermined size (the length, width and thickness thereof being 25 mm, 15 mm and 0.2 mm, respectively), and for a carbon electrode for an embodiment of the present invention.

The carbon electrode obtained in the above-mentioned manner was examined for discharging capacity and charge-discharge cycle characteristics as follows: The carbon electrode is immersed in the electrolytic cell 16 that contains a solution of propylene carbonate containing 1-M lithium perchlorate as an electrolyte and discharges up to 2.5 volts vs. the lithium reference electrode, and the density of the discharging capacity of 290 mA.h per gram of the carbon material is obtained. This result indicates that the carbon electrode of the present embodiment efficiently absorbs charge carrier lithium ions, although it is compressed after the electrochemical treatment. Moreover, for the purpose of determining the charge-discharge cycle characteristics, when the carbon electrode is repeatedly charged down to a potential of zero volts vs. the lithium reference electrode and then discharged up to 2.5 volts, the discharging capacity shows almost no decrease after more than 200 charge-discharge cycles.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A method for producing a carbon electrode comprising the steps of:
   directly depositing a carbon material on an electro-conductive electrode substrate by chemical vapor deposition using a starting material selected from the group consisting of hydrocarbons, hydrocarbon derivatives and mixtures thereof;
   subjecting said substrate having said carbon material directly deposited thereon to an electrochemical treatment so that said carbon material is doped with a charge carrier material capable of being reversely intercalated therein and deintercalated therefrom;
   compressing said substrate after said electrochemical treatment is subjected thereto; and
   producing a thin plate-shaped carbon electrode having a high density.

2. A method for producing a carbon electrode according to claim 1, wherein said electode substrate comprises a three-dimensionally structured substance.

3. A method for producing a carbon electrode according to claim 2, wherein said three-dimensionally structured substance is a substance selected from the group consisting of a metal sponge, a woven cloth of metal fibers, a nonwoven cloth of metal fibers, and a metal net.

4. A method for producing a carbon electrode according to claim 1, wherein said charge carrier material comprises an electron-donating substance selected from the group consisting of alkali metals, alkali earth metals and rare earth metals.

5. A method for producing a carbon electrode according to claim 1, wherein said charge carrier material comprises an electron-accepting substance selected from the group consisting of halogens, halogen compounds, metal oxides, oxo acids and hydrides.

6. A method for producing a carbon electrode according to claim 1, wherein said electrode substrate is a substance selected from the group consisting of foam, sponge, wool, woven cloth, non-woven cloth and net.

7. A method for producing a carbon electrode according to claim 1, wherein said starting material is selected from the group consisting of alipathic hydrocarbons, aromatic hydrocarbons and alicyclic hydrocarbons.

8. A method for producing a carbon electrode according to claim 1, wherein said starting material comprises hydrocarbons having a substituent selected from the group consisting of nitrogen, oxygen, halogen, hydroxyl group, sulfo group, nitro group, nitroso group, amino group, azo group and carboxy group.

9. A method for producing a carbon electrode according to claim 1, wherein said chemical vapor deposition is conducted by using argon as a carrier gas.

10. A method for producing a carbon electrode according to claim 1, wherein said step of compressing comprises rollers for compressing said substrate.

11. A method for producing a carbon electrode according to claim 1, wherein said step of compressing comprises a press-forming device for compressing said substrate.

* * * * *